(12) United States Patent
Pfeuffer et al.

(10) Patent No.: US 12,446,382 B2
(45) Date of Patent: Oct. 14, 2025

(54) OPTOELECTRONIC SEMICONDUCTOR COMPONENT AND PRODUCTION METHOD

(71) Applicant: ams-OSRAM International GmbH, Regensburg (DE)

(72) Inventors: Alexander Pfeuffer, Regensburg (DE); Korbinian Perzlmaier, Regensburg (DE); Christoph Klemp, Regensburg (DE)

(73) Assignee: ams-OSRAM International GmbH, Regensburg (DE)

( * ) Notice: Subject to any disclaimer, the term of this patent is extended or adjusted under 35 U.S.C. 154(b) by 385 days.

(21) Appl. No.: 18/245,355

(22) PCT Filed: Sep. 8, 2021

(86) PCT No.: PCT/EP2021/074706
§ 371 (c)(1),
(2) Date: Mar. 15, 2023

(87) PCT Pub. No.: WO2022/058217
PCT Pub. Date: Mar. 24, 2022

(65) Prior Publication Data
US 2024/0030397 A1 Jan. 25, 2024

(30) Foreign Application Priority Data
Sep. 17, 2020 (DE) .................. 10 2020 124 258.1

(51) Int. Cl.
*H10H 20/857* (2025.01)
*H10H 20/01* (2025.01)
(Continued)

(52) U.S. Cl.
CPC ........ *H10H 20/857* (2025.01); *H10H 20/018* (2025.01); *H10H 20/84* (2025.01); *H10H 20/819* (2025.01)

(58) Field of Classification Search
CPC .... H10H 20/857; H10H 20/84; H10H 20/018; H10H 20/819
(Continued)

(56) References Cited

U.S. PATENT DOCUMENTS

2004/0056254 A1  3/2004  Bader et al.
2010/0187548 A1  7/2010  Onushkin et al.
(Continued)

FOREIGN PATENT DOCUMENTS

DE  102008051048 A1  4/2010
DE  102015114446 A1  3/2016
(Continued)

OTHER PUBLICATIONS

Japanese office action issued for the corresponding Japanese patent application No. 2023-517682, dated Mar. 5, 2024, 5 pages (for informational purposes only).
(Continued)

*Primary Examiner* — Jami Valentine Miller
(74) *Attorney, Agent, or Firm* — Viering, Jentschura & Partner mbB

(57) ABSTRACT

An optoelectronic semiconductor component includes a layer stack, a first and second contact means, an electrically conductive edge layer, and a first dielectric layer. The layer stack includes a side surface and a first and a second main surface. The first and second contact means may be arranged at the first and second main surfaces, respectively. Said contact means may electrically contact a first and second semiconductor region of the layer stack, respectively. The second contact means may be radiation-transmissive. The electrically conductive edge layer may be arranged on the layer stack and extend from the second contact means over the side surface as far as the first main surface. The first dielectric layer may be arranged between the edge layer and
(Continued)

the layer stack. The second main surface may not be covered by the first dielectric layer.

20 Claims, 8 Drawing Sheets

(51) Int. Cl.
*H10H 20/84* (2025.01)
*H10H 20/819* (2025.01)

(58) Field of Classification Search
USPC .......................................................... 257/99
See application file for complete search history.

(56) References Cited

U.S. PATENT DOCUMENTS

| | | |
|---|---|---|
| 2012/0043572 A1 | 2/2012 | Engl et al. |
| 2012/0049229 A1 | 3/2012 | Lim et al. |
| 2012/0132943 A1 | 5/2012 | Hikosaka et al. |
| 2012/0223345 A1 | 9/2012 | Tomoda et al. |
| 2013/0181249 A1 | 7/2013 | Aoyagi et al. |
| 2014/0327034 A1 | 11/2014 | Toyota |
| 2015/0048404 A1 | 2/2015 | Katsuno et al. |
| 2015/0372207 A1 | 12/2015 | Kim et al. |
| 2016/0064611 A1* | 3/2016 | Choi .................. H10H 20/835 257/98 |
| 2016/0225749 A1* | 8/2016 | Leirer .................... H10H 29/10 |
| 2017/0005234 A1 | 1/2017 | Fehrer et al. |
| 2017/0309794 A1 | 10/2017 | Von Malm |
| 2018/0062047 A1 | 3/2018 | Biwa et al. |
| 2018/0248083 A1 | 8/2018 | Hoeppel et al. |
| 2020/0119223 A1* | 4/2020 | Kwag .................. H10H 20/841 |
| 2021/0005660 A1* | 1/2021 | Herrmann ............ H10H 20/818 |
| 2021/0083152 A1* | 3/2021 | Biebersdorf ........ H01L 25/0753 |
| 2021/0320226 A1 | 10/2021 | Sugawara et al. |
| 2021/0343914 A1* | 11/2021 | Leirer .................. H10H 20/852 |
| 2021/0351324 A1 | 11/2021 | Okuyama et al. |
| 2022/0102583 A1* | 3/2022 | Baumheinrich ... G02B 6/12007 |
| 2022/0406757 A1 | 12/2022 | Pfeuffer et al. |

FOREIGN PATENT DOCUMENTS

| | | |
|---|---|---|
| DE | 102015117198 A1 | 4/2017 |
| DE | 102016124380 A1 | 6/2018 |
| DE | 102018119734 A1 | 2/2020 |
| DE | 102019131502 A1 | 3/2021 |
| JP | H10161530 A | 6/1998 |
| JP | H10163530 A | 6/1998 |
| JP | 2003101074 A | 4/2003 |
| JP | 2008235883 A | 10/2008 |
| JP | 2012114389 A | 6/2012 |
| JP | 2012182276 A | 9/2012 |
| JP | 2013514642 A | 4/2013 |
| JP | 2013105917 A | 5/2013 |
| JP | 2013157496 A | 8/2013 |
| JP | 2013187332 A | 9/2013 |
| JP | 2015153793 A | 8/2015 |
| JP | 2017526180 A | 9/2017 |
| WO | 0182384 A1 | 11/2001 |
| WO | 2016157850 A1 | 10/2016 |
| WO | 2020044991 A1 | 3/2020 |
| WO | 2020064943 A1 | 4/2020 |
| WO | 2020080153 A1 | 4/2020 |

OTHER PUBLICATIONS

International Search Report issued for the corresponding PCT patent application No. PCT/EP2021/074706, dated Dec. 13, 2021, 5 pages (For informational purposes only).

German Search Report issued for the corresponding DE patent application No. 10 2020 124 258.1, dated Oct. 22, 2020, 5 pages (For informational purposes only).

Japanese office action issued for the corresponding Japanese patent application No. 2023-517682, dated Jul. 3, 2024, 6 pages (for informational purposes only).

Korean office action issued for the corresponding Korean patent application No. 10-2023-7010473, dated Jun. 17, 2025, 7 pages (for informational purposes only).

Japanese office action issued for the corresponding Japanese patent application No. 2023-517682, dated Jun. 17, 2025, 3 pages (for informational purposes only).

Decision on Grant for JP Application 2023-517682, dated Jun. 17, 2025, 2 pages (for refrence purpose only).

* cited by examiner

OPTOELECTRONIC SEMICONDUCTOR COMPONENT AND PRODUCTION METHOD

CROSS-REFERENCE TO RELATED APPLICATIONS

The present application is a national stage entry according to U.S.C. § 371 of PCT application No.: PCT/EP2021/074706 filed on Sep. 8, 2021; which claims priority to German patent application DE 10 2020 124 258.1, filed on Sep. 17, 2020; all of which are incorporated herein by reference in their entirety and for all purposes.

TECHNICAL FIELD

An optoelectronic semiconductor component and a method for producing the same are specified. For example, the optoelectronic semiconductor component is a flip chip.

BACKGROUND

In flip chips, charge carriers of a first and a second conductivity type are typically supplied and distributed below a semiconductor layer, i.e. not on an outer surface, of the flip chip. Contacting the semiconductor layer above an active zone requires rewiring in the component. There are flip chips that use etched blind holes to make the semiconductor layer electrically accessible. However, this leads to reduced area efficiency of the flip chip.

One objective to be achieved by the present disclosure is to specify an area-optimized optoelectronic semiconductor component. Another object to be achieved is to specify a method for producing an area-optimized optoelectronic semiconductor component.

SUMMARY

According to at least one embodiment of an optoelectronic semiconductor component, the optoelectronic semiconductor component comprises a layer stack comprising a first semiconductor region of a first conductivity type, a second semiconductor region of a second conductivity type, and an active zone arranged between the first and second semiconductor regions. For example, the first semiconductor region is a p-doped region and the second semiconductor region is an n-doped region. Further, the active zone may be provided for generating electromagnetic radiation.

Further, the layer stack comprises at least one side surface laterally delimiting the layer stack, and a first main surface and a second main surface opposite the first main surface, the first and second main surfaces each being arranged transverse, such as neither parallel nor perpendicular, to the side surface. In particular, the first main surface is a surface of the layer stack arranged on the side of the first semiconductor region and the second main surface is a surface of the layer stack arranged on the side of the second semiconductor region. In an embodiment, a majority of the generated radiation exits the semiconductor component on the side of the second main surface.

The layer stack may be the thickest layer of the optoelectronic semiconductor component. For example, the layer stack may account for 50% of the thickness of the optoelectronic semiconductor component. Here, the thickness denotes an extent perpendicular to a main extension plane of the semiconductor component, for example.

Furthermore, the optoelectronic semiconductor component comprises a first contact means arranged at the first main surface and provided for electrically contacting the first semiconductor region, and a second contact means arranged at the second main surface and provided for electrically contacting the second semiconductor region, the second contact means being radiation-transmissive, as well as an electrically conductive edge layer arranged on the layer stack and extending from the second contact means over the side surface as far as the first main surface.

The edge layer may be arranged downstream of the layer stack laterally, i.e. at the at least one side surface, at least in some areas.

Furthermore, the edge layer may comprise an end portion arranged at the second main surface and having a lateral extent corresponding to a thickness of the electrically conductive edge layer. In this context, a lateral extent corresponding to the thickness is understood to be both an equal or identical value and a value up to 2 times, in particular up to 1.5 times as large. For example, an equal or identical value is obtained in the case of a right angle between the edge layer and the second main surface, while the higher values are assumed for smaller angles, in particular for angles greater than 30° and smaller than 90°.

For example, the edge layer may be formed at the second main surface without kinks or curvature. The edge layer may thus be arranged conformally on the at least one side surface.

In particular, the edge layer enables electrical contacting of the second semiconductor region on the side of the first main surface.

In an embodiment, the second semiconductor region is arranged on a front side of the optoelectronic semiconductor component intended for radiation emission and the first semiconductor region is arranged on a rear side of the optoelectronic semiconductor component opposite the front side.

In addition, the optoelectronic semiconductor component comprises a first dielectric layer arranged between the edge layer and the layer stack, the second main surface not being covered by the first dielectric layer. In particular, the first dielectric layer provides electrical insulation of a p-n junction of the active zone. The first dielectric layer may consist of a single layer. Alternatively, the first dielectric layer may comprise multiple layers, in particular with alternating refractive indices. In this case, the first dielectric layer may additionally have a mirror function.

Suitable materials for the first dielectric layer include oxide and nitride compounds such as AlxOy, SiOx, SixNy, NbOx, TiOx, HfOx, TaOx, AlxNy and TixNy, as well as organic polymers such as parylene, BCB, silicones, siloxanes, photoresists, spin-on glasses, organic-inorganic hybrid materials, epoxies and acrylics.

The first dielectric layer may be arranged downstream of the layer stack laterally, i.e. at the at least one side surface, at least in some areas.

Furthermore, the first dielectric layer may comprise an end portion arranged at the second main surface and having a lateral extent corresponding to a thickness of the first dielectric layer. In this context, a lateral extent corresponding to the thickness is understood to be both an equal or identical value and a value up to 2 times, in particular up to 1.5 times as large. For example, an equal or identical value is obtained in the case of a right angle between the first dielectric layer and the second main surface, while the higher values are assumed for smaller angles, in particular for angles greater than 30° and smaller than 90°.

For example, the first dielectric layer may be formed at the second main surface without kinks or curvature. The first dielectric layer may thus be arranged conformally on the at least one side surface.

According to at least one embodiment, the second contact means touches the first dielectric layer.

The active zone may contain a sequence of individual layers by means of which a quantum well structure, in particular a single quantum well (SQW) or multiple quantum well (MQW) structure, is formed.

Furthermore, the first and second semiconductor regions may comprise one or more semiconductor layers. Suitable materials for the semiconductor layers of the semiconductor regions are materials based on nitride, phosphide or arsenide compound semiconductors. "Based on nitride, phosphide or arsenide compound semiconductors" means in the present context that the semiconductor layers contain $Al_nGa_mIn_{1-n-m}N$, $Al_nGa_mIn_{1-n-m}P$ or $Al_nGa_mIn_{1-n-m}As$, where $0 \leq n \leq 1$, $0 \leq m \leq 1$ and $n+m \leq 1$. This material does not necessarily have to have a mathematically exact composition according to the above formula. Rather, it may include one or more dopants as well as additional constituents that do not substantially change the characteristic physical properties of the $Al_nGa_mIn_{1-n-m}N$, $Al_nGa_mIn_{1-n-m}P$ or $Al_nGa_mIn_{1-n-m}As$ material. For the sake of simplicity, however, the above formula includes only the essential constituents of the crystal lattice (Al, Ga, In, P and As, respectively), even if these may be partially replaced by small amounts of other substances.

According to at least one embodiment, the second main surface is substantially not covered by the edge layer, i.e. within usual manufacturing tolerances. In an embodiment, the edge layer does not project beyond the second main surface on a side of the second main surface facing away from the layer stack. In other words, the edge layer may not project beyond the second main surface in a vertical direction. In an embodiment, the edge layer is flush with the second main surface. This can be the case for manufacturing reasons if the edge layer is deposited on the layer stack before the second main surface is exposed and is also removed during exposure.

According to at least one embodiment, the second semiconductor region comprises a contact layer arranged at the second main surface and formed from semiconductor material, and on which the second contact means is at least partially directly arranged. In particular, the contact layer is a highly doped semiconductor layer.

In an advantageous embodiment, the second contact means contains or consists of at least one of the following materials: TCO, metal, semiconductor, graphene.

The term "TCO" refers to a transparent conductive oxide. TCOs are transparent conductive materials, usually metal oxides, such as zinc oxide, tin oxide, cadmium oxide, titanium oxide, indium oxide or indium tin oxide (ITO). In addition to binary metal oxygen compounds, such as ZnO, $SnO_2$ or $In_2O_3$, ternary metal oxygen compounds, such as $Zn_2SnO_4$, CdSnO3, $ZnSnO_3$, $MgIn_2O_4$, $GaInO_3$, $Zn_2In_2O_5$ or $In_4Sn_3O_{12}$, or mixtures of different transparent conductive oxides also belong to the group of TCOs. Furthermore, the TCOs do not necessarily correspond to a stoichiometric composition and may also be p- or n-doped.

In an embodiment, the second contact means is a layer applied to the second main surface. The second contact means may be a homogeneous layer, in particular if it is formed from a TCO, or a structured layer, for example if it is formed from metal. For example, the second contact means may be designed as a metal grid or as an inverted metal grid.

In particular, at least 20%, or at least 50%, such as at least 80% of the second main surface is covered by the second contact means.

According to at least one embodiment, the one or more side surface(s) of the layer stack is/are covered by the edge layer at least for the most part. In an embodiment, all side surfaces of the layer stack are completely covered by the edge layer.

In an embodiment, the edge layer forms a mirror coating of the layer stack. This allows the radiation generated by the active zone to be advantageously redirected to the second main surface. In this case, the edge layer can contain or consist of a metal, with Rh, Al, Cr, Ti, Pt, W, Au and Ni being particularly suitable metals.

According to at least one embodiment, the edge layer contains or consists of at least one of the following materials: TCO, metal, graphene.

According to at least one embodiment, the optoelectronic semiconductor component is electrically connectable from the outside on a side of the first main surface by means of the first contact means and the edge layer. In this case, the first main surface is partially covered by the edge layer, the edge layer serving as a contact pad of the second conductivity type. The edge layer and the second contact means can be formed from different materials. In particular, the first contact means contains or consists of a metal or a metal compound.

Furthermore, the optoelectronic semiconductor component may comprise a third contact means arranged at the first main surface. The third contact means may serve as a contact pad of the second conductivity type and is electrically conductively connected to the edge layer. The edge layer and the third contact means may be formed from different materials. In particular, the third contact means contains or consists of a metal or a metal compound. By means of the first contact means and the third contact means, the optoelectronic semiconductor component is electrically connectable from the outside on a side of the first main surface.

The means for electrical contacting of the first and second semiconductor regions are arranged outside the layer stack, so that no area is "consumed" for the contacting and thus the area efficiency can be improved. In addition, the semiconductor component becomes scalable due to the outside contacting. In particular, the semiconductor component is free of vias.

Furthermore, it is possible that the semiconductor component is free of a carrier.

In one possible embodiment, the optoelectronic semiconductor component comprises a second dielectric layer arranged on the edge layer and electrically insulating the edge layer from the outside at the first main surface. Furthermore, the edge layer at the at least one side surface can be electrically insulated toward the outside by the second dielectric layer. For the second dielectric layer, the materials mentioned for the first dielectric layer are particularly suitable.

According to at least one embodiment, the optoelectronic semiconductor component is electrically connectable from the outside on two opposite sides by means of the first and second contact means. Here, the second contact means serves as a contact pad of a second conductivity type.

According to an embodiment, the layer stack is mesa-shaped, with the second main surface being larger than the first main surface. Radiation emission then takes place in particular on the side of the larger main surface.

The second main surface may be flat. Alternatively, the second semiconductor region may comprise structural elements or be roughened on the second main surface, for example to increase radiation outcoupling. Furthermore, the semiconductor component may comprise an outcoupling structure arranged on the second main surface, in particular to increase radiation outcoupling.

Various embodiments are possible for the first contact means, which serves as a contact pad of a first conductivity type, and for the edge layer and the third contact means, respectively, which serve as a contact pad of a second conductivity type.

For example, the first contact means may be arranged centrally on the first main surface and surrounded on all sides by the edge layer or the third contact means. It is also possible for the first contact means to be arranged at the edge and only partially circumferentially surrounded by the edge layer or the third contact means. It is also possible for the first and third contact means to be arranged next to each other on the first main surface. At least the first dielectric layer is located between them for electrical insulation. Furthermore, the first and second dielectric layers may also be located therebetween for electrical insulation.

The method described below is suitable for producing an optoelectronic semiconductor component or a plurality of optoelectronic semiconductor components of the type mentioned above. Features described in connection with the semiconductor component can therefore also be used for the method and vice versa.

According to at least one embodiment of a method for producing at least one optoelectronic semiconductor component of the type mentioned above, the method comprises the following steps:
  Providing a semiconductor wafer comprising a carrier and a semiconductor layer sequence arranged on the carrier,
  producing at least one layer stack by creating at least one recess in the semiconductor wafer starting from a side of the semiconductor layer sequence facing away from the carrier,
  depositing a first dielectric layer on the semiconductor wafer such that the layer stack is covered by the first dielectric layer,
  depositing an electrically conductive layer, provided to form an edge layer, on the first dielectric layer,
  exposing a second main surface of the layer stack, wherein portions of the first dielectric layer and the second semiconductor region are removed in a common step.

In an embodiment, the method steps are carried out in the sequence indicated. In particular, this means that the edge layer is deposited on the first dielectric layer before the second main surface is exposed. Furthermore, portions of the edge layer are removed during the exposure of the second main surface. In particular, when exposing the second main surface, portions of the edge layer can be removed in such a way that the edge layer does not project beyond the second main surface on a side of the second main surface facing away from the layer stack or is flush with the second main surface.

In an embodiment, the carrier is a growth substrate on which the semiconductor layer sequence is epitaxially grown. In particular, the second semiconductor region is grown on the carrier and the first semiconductor region is grown on the second semiconductor region. When exposing the second main surface, in particular portions of the second semiconductor region are removed.

In an embodiment of the method, a plurality of layer stacks are singulated by the step of exposing the second main surface. This is done in particular by thinning the semiconductor wafer starting from the carrier side up to the at least one recess.

In an embodiment, the exposure of the second main surface is performed by means of polishing and/or etching and/or a laser lift-off process.

The method and the structure of the semiconductor component allow the contact of the second semiconductor region to be established without the use of conventional photolithographic process steps.

The optoelectronic semiconductor component is particularly suitable for video walls, projectors and high-performance components.

BRIEF DESCRIPTION OF THE DRAWINGS

Further advantages, advantageous embodiments and further developments will become apparent from the exemplary embodiments described below in connection with the figures.

FIGS. 1-4B and 7-11A show schematic cross-sectional views of various steps of a method for producing an optoelectronic semiconductor component according to a first exemplary embodiment.

In the exemplary embodiments and figures, identical elements, elements of the same kind or elements having the same effect may each be provided with the same reference signs. The elements shown and their proportions to one another are not necessarily to be regarded as true to scale;

rather, individual elements may be shown exaggeratedly large for better representability and/or better understanding.

DETAILED DESCRIPTION

Figure 1:
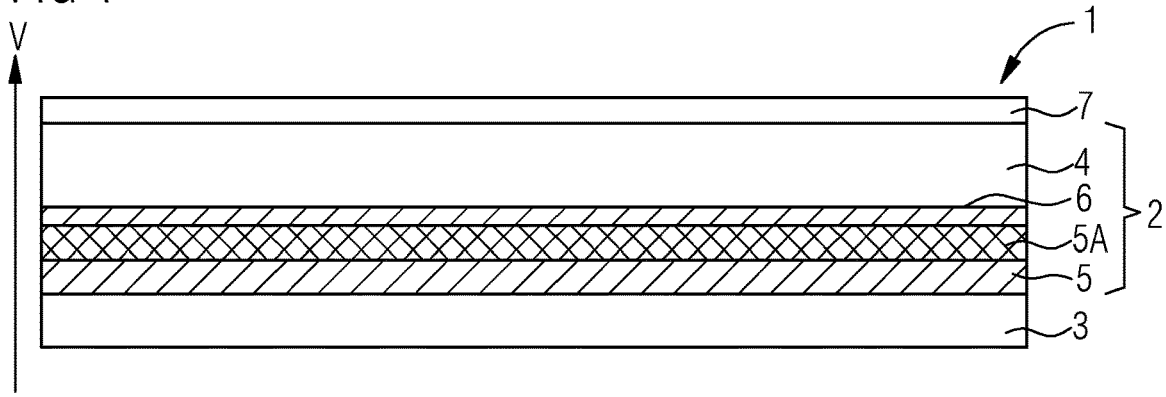

FIG. 1 shows an initial step of a method for producing an optoelectronic semiconductor component according to a first exemplary embodiment, wherein a semiconductor wafer 1 is provided which comprises a semiconductor layer sequence 2 and a carrier 3 on which the semiconductor layer sequence 2 is deposited. The semiconductor layer sequence 2 includes a first semiconductor region 4 of a first conductivity type, a second semiconductor region 5 of a second conductivity type, and an active zone 6 arranged between the first and second semiconductor regions 4, 5. The first semiconductor region 4 is arranged downstream of the second semiconductor region 5 in a vertical direction V. For example, the first semiconductor region 4 is a p-doped region and the second semiconductor region 5 is an n-doped region. Furthermore, the carrier 3 may be a growth substrate on which the semiconductor layer sequence 2 is epitaxially grown. Furthermore, the semiconductor wafer 1 comprises a contact layer 7 for electrically contacting the first semiconductor region 4, said contact layer 7 being arranged on the first semiconductor region 4. The contact layer 7 may be formed from a TCO and/or a metal.

Suitable materials for the semiconductor regions 4, 5 and the active zone 6 as well as semiconductor layers contained therein are materials based on nitride, phosphide or arsenide compound semiconductors, as already mentioned above. "Based on nitride, phosphide or arsenide compound semiconductors" means in the present context that the semiconductor regions 4, 5 and the active zone 6 or the semiconductor layers contained therein contain $Al_nGa_mIn_{1-n-m}N$, $Al_nGa_mIn_{1-n-m}P$ or $Al_nGa_mIn_{1-n-m}As$, where $0 \leq n \leq 1$, $0 \leq m \leq 1$ and $n+m \leq 1$.

Figure 2:
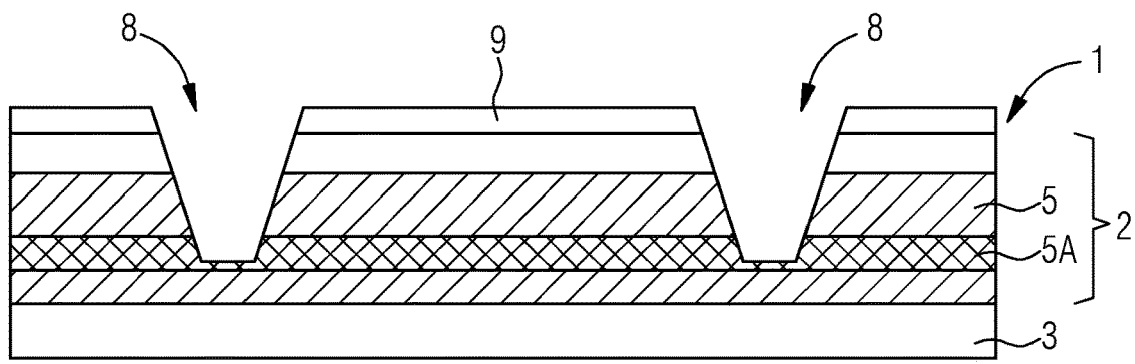

FIG. 2 shows a subsequent method step, in which the semiconductor wafer 1 is structured to produce layer stacks 9. In particular, for the production of a layer stack 9, a recess 8 is formed in the semiconductor wafer 1 starting from a side of the semiconductor layer sequence 2 facing away from the carrier 3. The recess 8 may be formed in the shape of a frame in top view of the semiconductor layer sequence 2. Further, the recess 8 may have a cross-section tapering in the direction of the carrier 3. As a result, the layer stack 9 advantageously has a mesa-shaped design. The recess 8 may extend at least into a contact layer 5A of the second semiconductor region 5.

Figure 3:
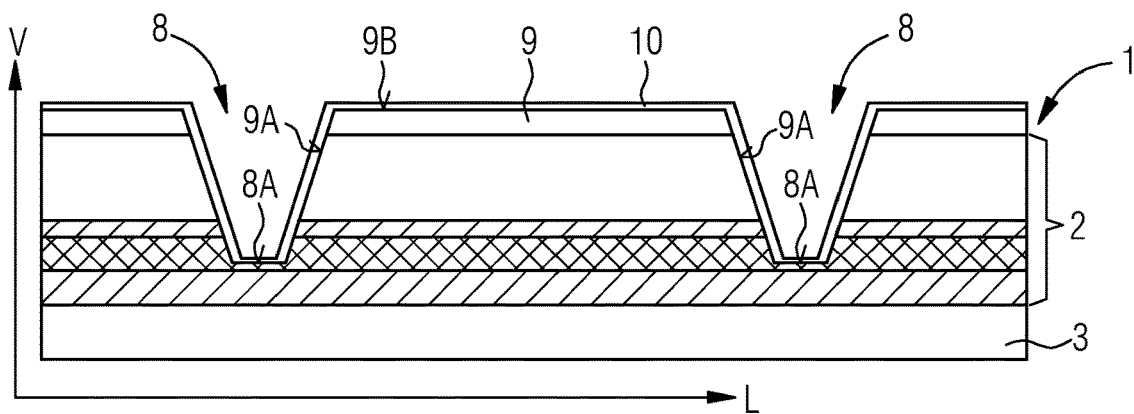

FIG. 3 shows a next method step, in which a first dielectric layer 10 is deposited on the semiconductor wafer 1 on a side of the semiconductor layer sequence 2 facing away from the carrier 3, the layer stack 9 being covered by the first dielectric layer 10. In an embodiment, the first dielectric layer 10 is applied over an entire surface of the semiconductor wafer 1 which outwardly delimits the semiconductor wafer 1 on a side of the semiconductor layer sequence 2 facing away from the carrier 3.

In particular, side surfaces 9A of the layer stack 9, which laterally delimit the layer stack 9, are completely covered by the first dielectric layer 10. "Lateral" here refers to lateral directions L arranged transverse, in particular perpendicular, to the vertical direction V. Furthermore, a first main surface 9B of the layer stack 9 arranged transverse to the side surfaces 9A is completely covered by the first dielectric layer 10.

Furthermore, the dielectric layer 10 is arranged on a bottom surface 8A of the recess 8.

Figure 4A:
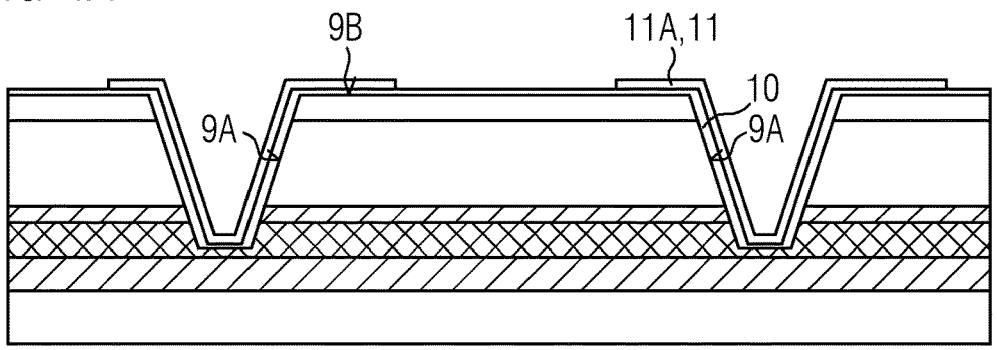

FIG. 4A shows a further method step, in which an electrically conductive layer 11A is deposited on the first dielectric layer 10. In particular, the electrically conductive layer 11A is applied over the entire surface of the dielectric layer 10 and then opened, thereby forming an edge layer 11 arranged on the side surfaces 9A and partially on the first main surface 9B.

Figure 4B:
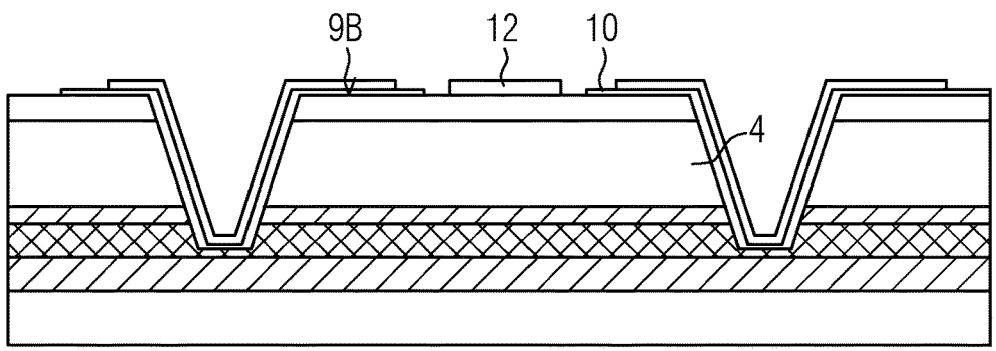

As shown in FIG. 4B, the dielectric layer 10 is also opened so that the first main surface 9B has an uncovered region. In the uncovered region, a first contact means 12 is arranged which is provided for electrically contacting the first semiconductor region 4. In particular, the first contact means 12 is formed from a metal or a metal compound and serves as a contact pad of the first conductivity type.

Figure 5:
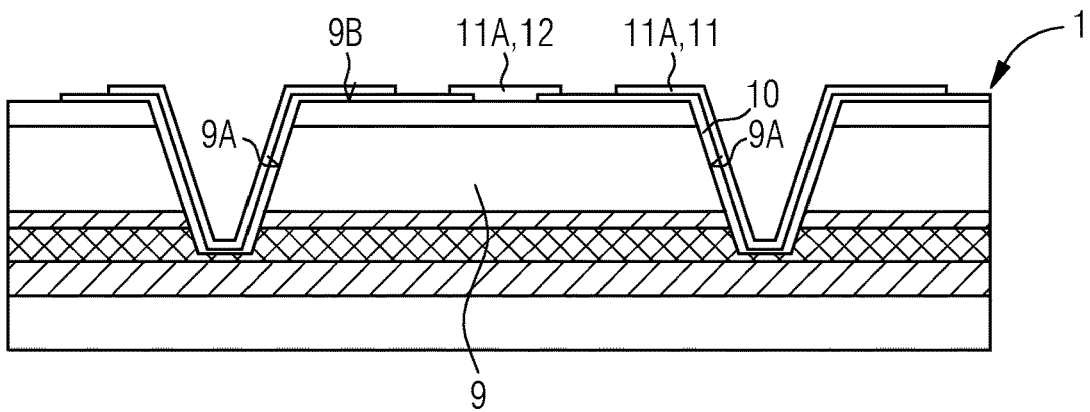
FIG. 5 shows a schematic cross-sectional view of a step of a method for producing an optoelectronic semiconductor component according to a second exemplary embodiment.

FIG. 5 shows a method step of a method according to a second exemplary embodiment, in which the dielectric layer 10 is opened before the electrically conductive layer 11A is applied. The electrically conductive layer 11A is applied over the entire surface of the semiconductor wafer 1 and is arranged directly on the first main surface 9B in the opened region. Subsequently, the electrically conductive layer 11A is structured such that an edge layer 11 arranged on the side surfaces 9A of the layer stack 9 and a first contact means 12 arranged on the first main surface 9B are formed therefrom.

The electrically conductive layer 11A can be formed in a single layer or in multiple layers and contain a TCO and/or metal and/or graphene. Accordingly, the edge layer 11 and the first contact means 12 can be formed in a single layer or in multiple layers and contain a TCO and/or metal and/or graphene.

Figure 6:
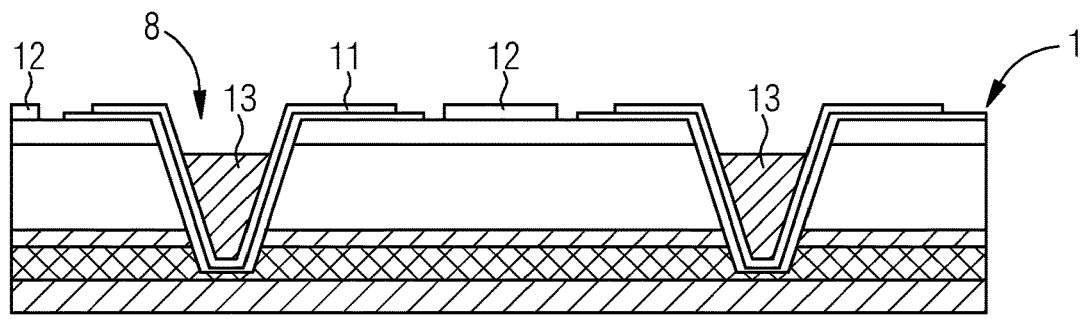
FIG. 6 shows a schematic cross-sectional view of a step of a method for producing an optoelectronic semiconductor component according to a third exemplary embodiment.

FIG. 6 shows a method step of a method according to a third exemplary embodiment, in which a filling 13 for stabilizing the semiconductor wafer 1 is arranged in the recesses 8 after the edge layer 11 has been produced. A suitable material for the filling 13 is a plastic material, for example.

Figure 7:
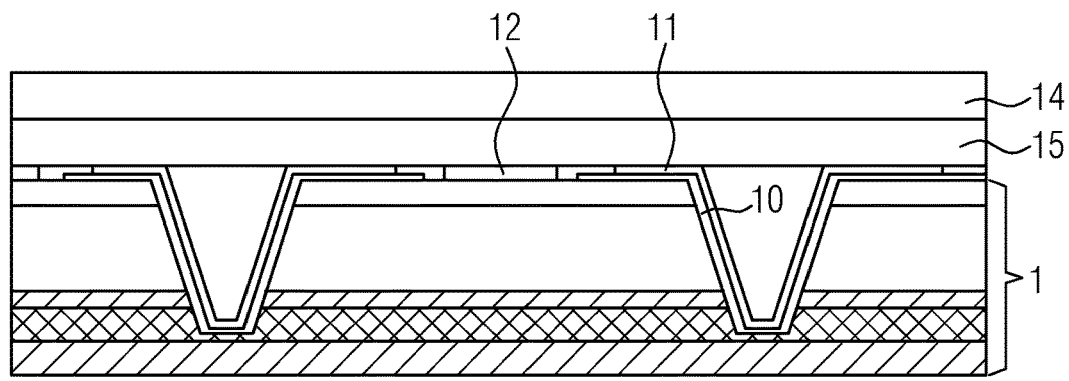

FIG. 7 shows a further method step, in which an intermediate carrier 14, for example a plastic carrier, is arranged on a side of a composite comprising the semiconductor wafer 1 and the additionally applied layers 10, 11, 12 opposite the carrier side, which intermediate carrier 14 is held to the composite by means of a connection layer 15, for example a film which can be removed by UV radiation or heat. After the intermediate carrier 14 has been provided, the carrier 3 can be removed.

Figure 8:
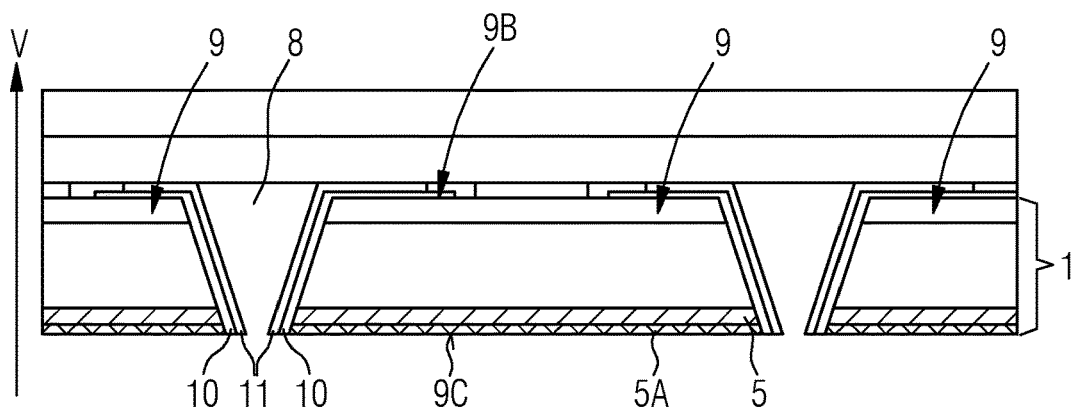

FIG. 8 shows a subsequent method step, in which a second main surface 9C of the layer stack 9 opposite the first main surface 9B is exposed. In particular, portions of the second semiconductor region 5 are removed up to the contact layer In this process, the regions of the first dielectric layer 10 and of the edge layer 11 arranged in the recess 8 are also removed, so that in particular the first dielectric layer 10 and the edge layer 11 are flush with the second main surface 9C, or so that the edge layer 11 does not project beyond the second main surface 9C on a side of the second main surface 9C facing away from the layer stack 9.

In the vertical direction V, the semiconductor wafer 1 is thinned at least up to the bottom surface 8A (cf. in this respect FIG. 3) of the recess 8, so that the layer stacks 9 connected by the second semiconductor region 5 are separated from each other or singulated.

In an embodiment, the exposure of the second main surface 9C is performed by means of polishing and/or etching and/or a laser lift-off process.

Figure 9:
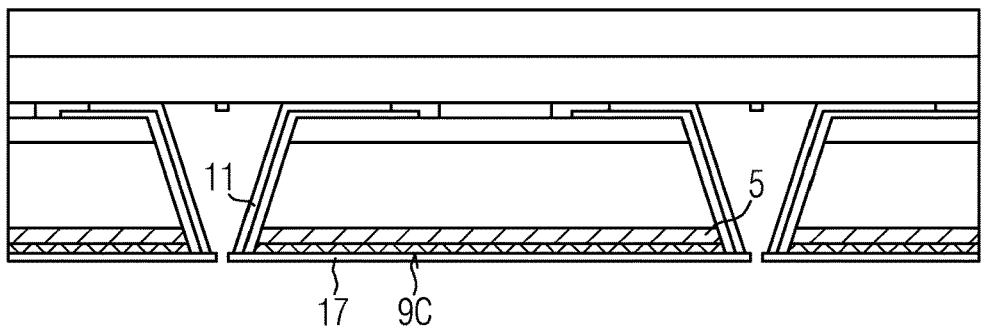

FIG. 9 shows a further method step in which a second contact means 17, which is provided for electrically contacting the second semiconductor region 5, is applied to the second main surface 9C. The second contact means 17 projects laterally beyond the second main surface 9C so that the second contact means 17 touches the first dielectric layer 10 and the edge layer 11.

The second contact means 17 may contain or consist of at least one of the following materials: TCO, metal, semiconductor, graphene. In an embodiment, the second contact means 17 is a homogeneous or structured layer applied to the second main surface 9C. In particular, at least 20%, or at least 50%, such as at least 80% of the second main surface is covered by the second contact means 9C.

Figure 10:
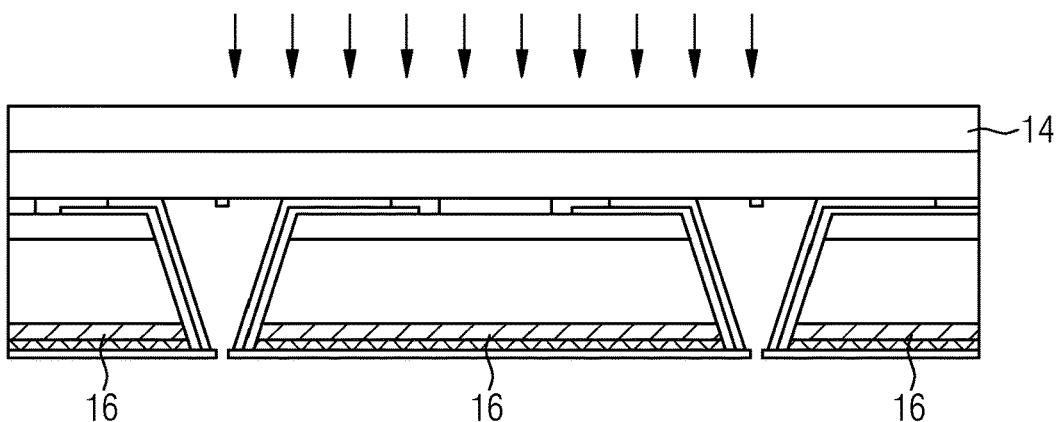

FIG. 10 shows a further method step, in which the intermediate carrier 14 is partially or completely detached, for example by the action of UV radiation or heat (indicated by arrows), so that at least some of the optoelectronic semiconductor components 16 no longer adhere or only adhere weakly to the intermediate carrier 14.

Figure 11A:
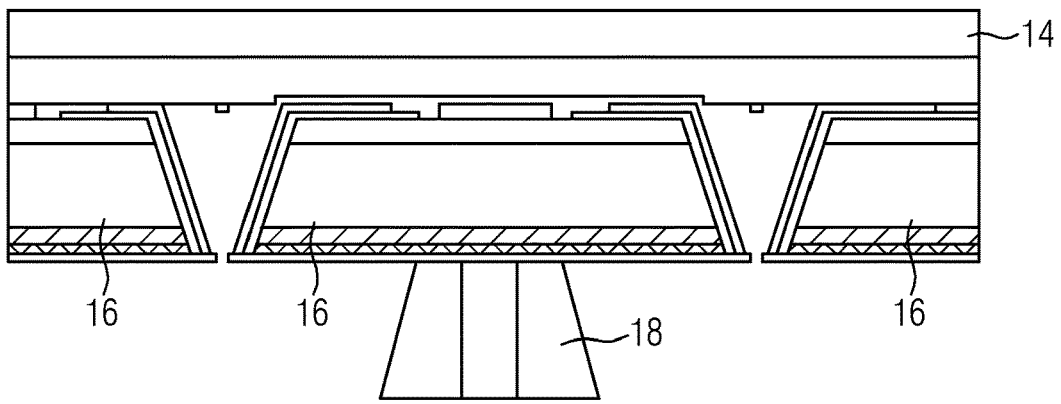

FIG. 11A shows a further method step, in which the optoelectronic semiconductor components 16 are transferred by means of a transfer device 18, for example a suction nozzle or a stamp.

Figure 11B:
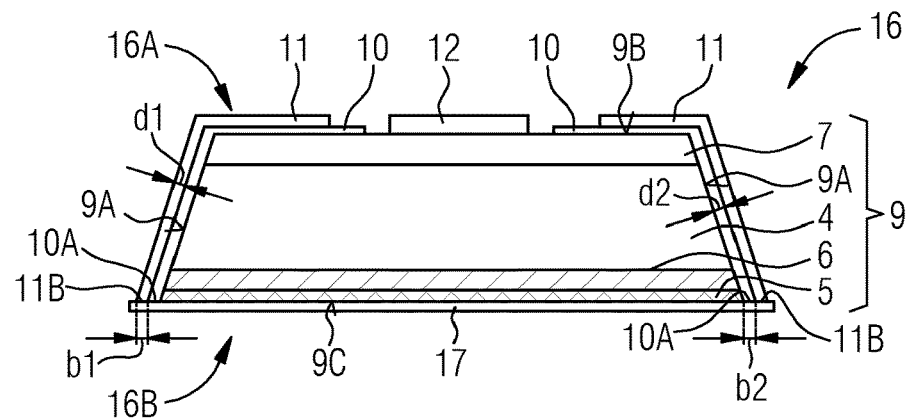
FIG. 11B shows a schematic cross-sectional view of an optoelectronic semiconductor component according to a first exemplary embodiment.

FIG. 11B shows an optoelectronic semiconductor component 16 which can be produced by means of a method according to the first or third exemplary embodiment. Features described in connection with the methods may therefore also apply to the optoelectronic semiconductor component 16 and vice versa.

The optoelectronic semiconductor component 16 comprises a layer stack 9 comprising a first semiconductor region 4 of a first conductivity type, a second semiconductor region 5 of a second conductivity type, and an active zone 6 arranged between the first and second semiconductor regions, the active zone 6 being provided in particular for emitting electromagnetic radiation in the visible, ultraviolet or infrared spectral range. Furthermore, the layer stack 9 comprises a plurality of side surfaces 9A laterally delimiting the layer stack 9, as well as a first main surface 9B and a second main surface 9C opposite the first main surface 9B, the first and second main surfaces 9B, 9C each being arranged transverse, in particular not perpendicular, to the side surface 9A.

The optoelectronic semiconductor component 16 further comprises a first contact means 12 arranged at or on the first main surface 9B and provided for electrically contacting the first semiconductor region 4, and a second contact means 17 arranged at or on the second main surface 9C and provided for electrically contacting the second semiconductor region 5, the second contact means 17 being radiation-transmissive.

Furthermore, the optoelectronic semiconductor component 16 comprises an electrically conductive edge layer 11 arranged on the layer stack 9 and extending from the second contact means 17 over the side surfaces 9A as far as the first main surface 9B. The edge layer 11 comprises an end portion 11B arranged at the second main surface 9C and having a lateral extent b1 corresponding to a thickness d1 of the electrically conductive edge layer 11. In this context, a lateral extent b1 corresponding to the thickness d1 is understood to be both an equal or identical value and a value up to 2 times, in particular up to 1.5 times as large. For example, an equal or identical value is obtained in the case of a right angle between the edge layer 11 and the second main surface 9C, while the higher values are assumed for smaller angles, in particular for angles greater than 30° and smaller than 90°.

For example, the edge layer 11 may be formed at the second main surface 9C without kinks or curvature. The edge layer 11 may thus be arranged conformally on the side surfaces 9A.

In an embodiment, the edge layer 11 forms a mirror coating of the layer stack 9. This allows the radiation generated by the active zone 6 to be advantageously redirected to the second main surface 9C. In this case, the edge layer 11 can advantageously contain or consist of a metal, with Rh, Al, Cr, Ti, Pt, W, Au and Ni being particularly suitable metals.

In addition, the optoelectronic semiconductor component 16 comprises a first dielectric layer 10 arranged between the edge layer 11 and the layer stack 9, the second main surface 9C not being covered by the first dielectric layer 10.

In an embodiment, all side surfaces 9A of the layer stack 9 are completely covered by the dielectric layer 10 and the edge layer 11.

The first dielectric layer 10 comprises an end portion 10A arranged at the second main surface 9C, the end portion 10A having a lateral extent b2 corresponding to a thickness d2 of the first dielectric layer 10. In this context, a lateral extent b2 corresponding to the thickness d2 is understood to be both an equal or identical value and a value up to 2 times, in particular up to 1.5 times as large. For example, an equal or identical value is obtained in the case of a right angle between the dielectric layer and the second main surface 9C, while the higher values are assumed for smaller angles, in particular for angles greater than 30° and smaller than 90°.

For example, the first dielectric layer 10 may be formed at the second main surface 9C without kinks or curvature. The first dielectric layer 10 may thus be arranged conformally on the at least one side surface 9C.

The edge layer 11 enables electrical contacting of the second semiconductor region 5 or the semiconductor component 16 on its rear side 16A, although the second contact means 17 is arranged on a front side 16B of the semiconductor component 16. Also, the first contact means 12 is arranged on the rear side 16A, so that the optoelectronic semiconductor component 16 is electrically connectable from the outside on a side of the first main surface 9B or on its rear side 16A by means of the first contact means 12 and the edge layer 11. This is because the first main surface 9B is partially covered by the edge layer 11, the edge layer 11 serving as a contact pad of the second conductivity type.

The optoelectronic semiconductor component 16 shown in FIG. 11B is a flip chip. Here, the means 11, 12 for electrical contacting of the first and second semiconductor regions 4, 5 are arranged outside the layer stack 9 so that no area is "consumed" for the contacting and thus the area efficiency can be improved compared to conventional flip chips. In addition, the semiconductor component 16 becomes scalable due to the outside contacting.

Figure 12:
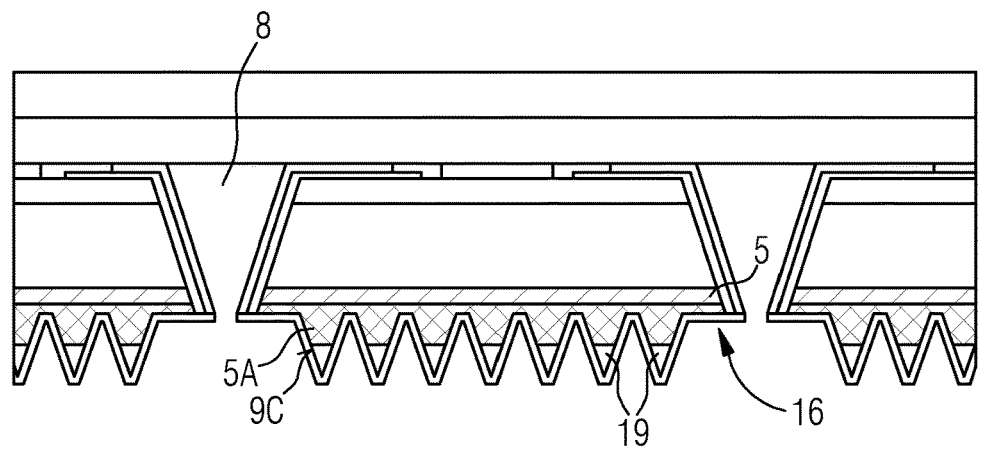
FIG. 12 shows a schematic cross-sectional view of a step of a method for producing an optoelectronic semiconductor component and a schematic cross-sectional view of an optoelectronic semiconductor component according to a fourth exemplary embodiment.

FIG. 12 shows a method step or an optoelectronic semiconductor component 16 according to a fourth exemplary embodiment. In contrast to the exemplary embodiment shown in FIG. 11B, the second main surface 9C is not formed flat. Rather, the second semiconductor region 5 comprises structural elements 19, particularly for increasing radiation outcoupling. In order to enable the generation of the structural elements 19, the recess 8 is formed so deep that it extends into a region of the second semiconductor region 5 arranged between the contact layer 5A and the carrier 3 (cf. FIG. 2), so that the region to be structured has a sufficient thickness for the structuring.

Figure 13:
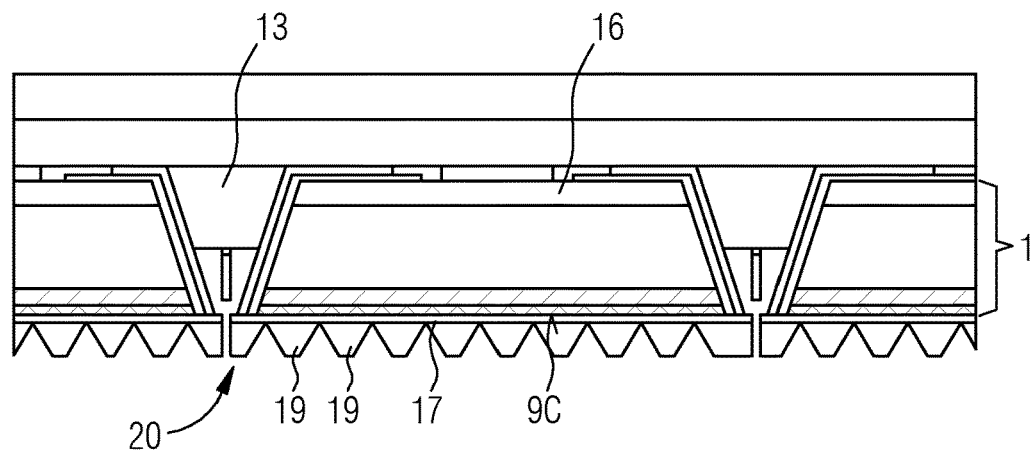
FIG. 13 shows a schematic cross-sectional view of a step of a method for producing an optoelectronic semiconductor component and a schematic cross-sectional view of an optoelectronic semiconductor component according to a fifth exemplary embodiment.

FIG. 13 shows a method step or an optoelectronic semiconductor component 16 according to a fifth exemplary embodiment. Here, the optoelectronic semiconductor component 16 comprises an outcoupling structure 20 arranged on the second main surface 9C, in particular for increasing radiation outcoupling.

The outcoupling structure 20 can be produced, for example, by applying a radiation-transmissive layer, which is in particular made of a dielectric, refractive-index-matched material, for example Nb2O5, and has a thickness of 0.5 μm to 1.5 μm, to the second main surface 9C and the second contact means 17, respectively, and structuring it so that it comprises a plurality of structural elements 19.

For example, to stabilize the semiconductor wafer 1, a filling 13 can be arranged in the recess 8, said filling 13 also being removed when the semiconductor wafer 1 is thinned.

Figure 14:
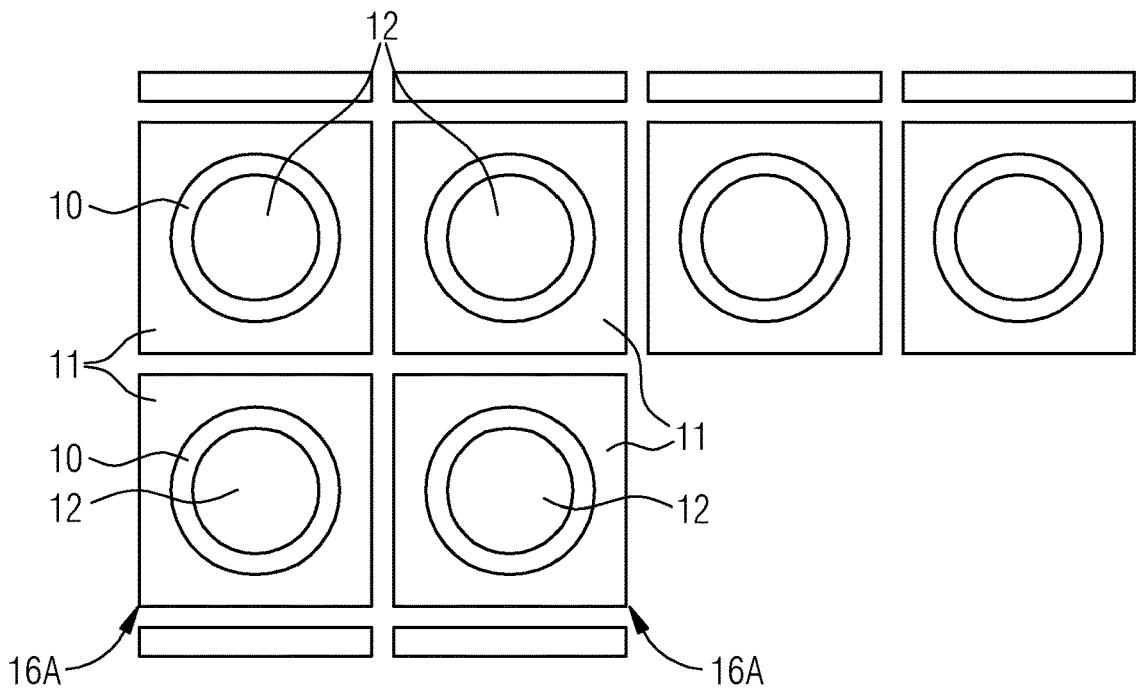
FIGS. 14-16 show schematic top views of rear sides of optoelectronic semiconductor components according to various exemplary embodiments.
Figure 15:
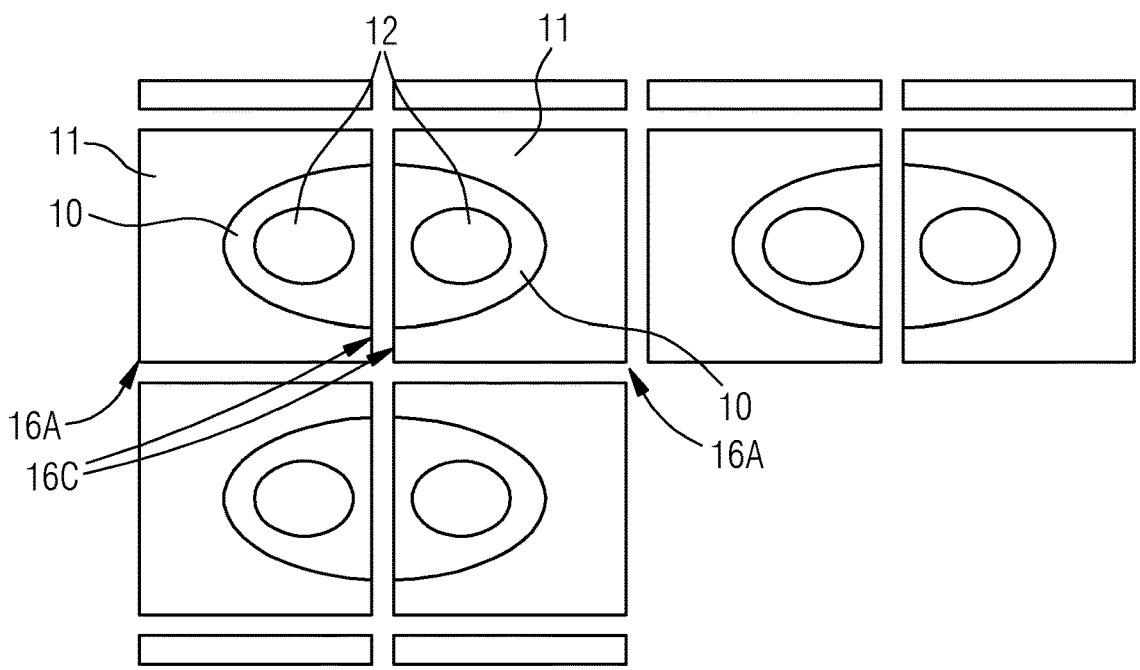
Figure 16:
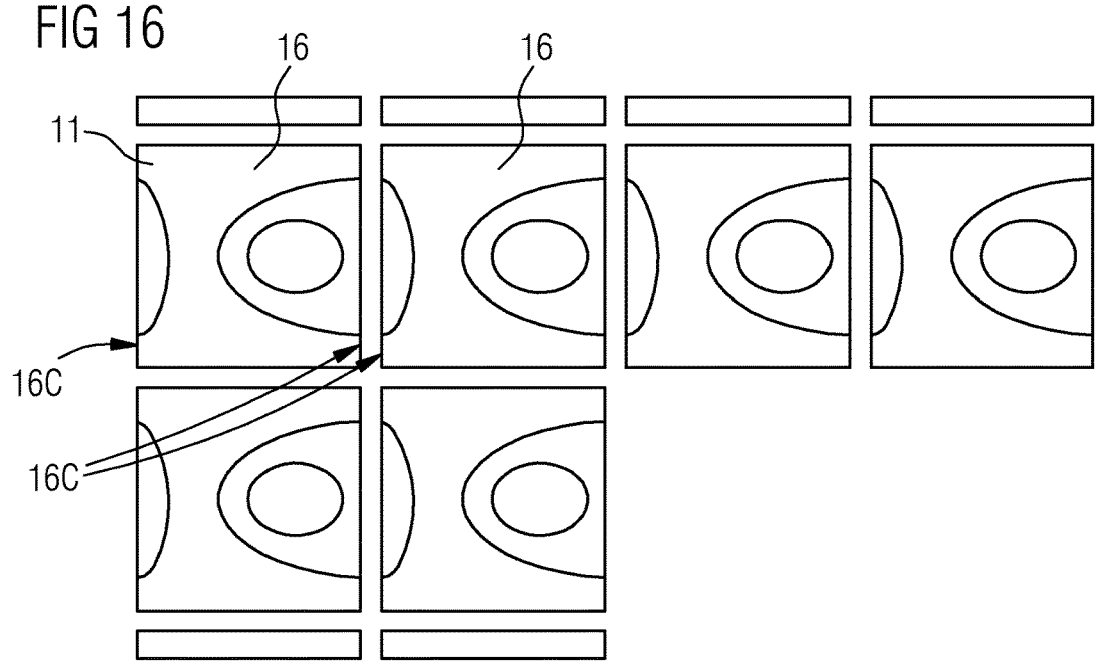

With reference to FIGS. 14 to 16, various options for the design of the first contact means 12 and the edge layer 11 on the rear side are explained.

For example, the first contact means 12 can be arranged centrally on the first main surface and surrounded on all sides by the edge layer 11, with the dielectric layer 10 arranged in between as an electrical insulation (cf. FIG. 14). The first contact means 12 can be circular, for example. The dielectric layer 10 can have an annular shape.

It is also possible for the first contact means 12 to be arranged on the edge side and thus off-center, and to be only partially circumferentially surrounded by the edge layer 11 (cf. FIG. 15). In this case, the first contact means 12 can be elliptical, for example. The dielectric layer 10 can have a parabolic shape.

In particular, during production in composite, the first contact means 12 of two adjacent components 16 can each be arranged on a side edge 16C facing the adjacent component 16. Advantageously, the electrically conductive layers of two adjacent components 16 can thus be opened in a single step when the first contact means 12 are produced. Also, the edge-side arrangement of the contact means 12 facilitates a serial connection of two semiconductor components 16.

As shown in FIG. 16, an opening in the electrically conductive layer need not terminate at the side edge 16C of the component 16 as in the exemplary embodiment shown in FIG. 15, but may extend into the electrically conductive layer of the adjacent component 16 so that the edge layer 11 of a component 16 is retracted from two opposite side edges 16C.

Figure 17A:
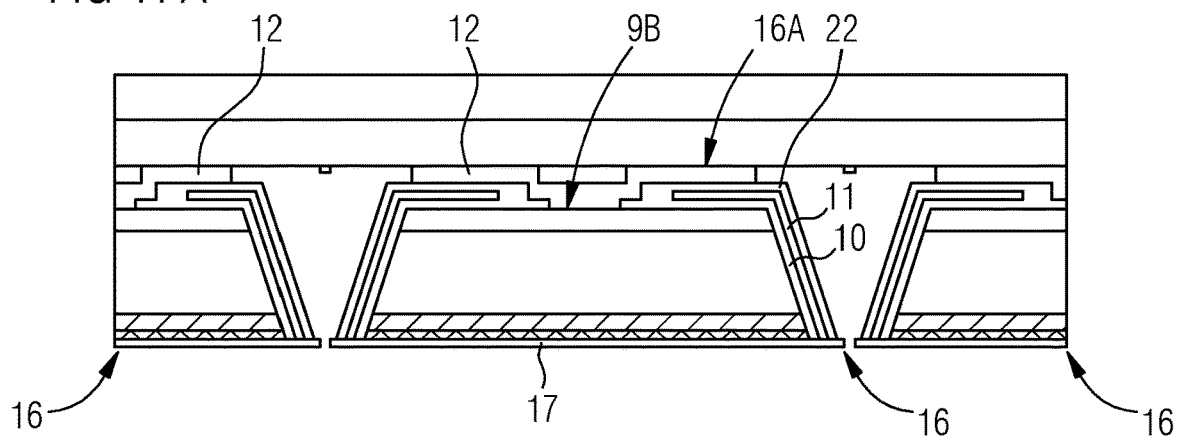
FIG. 17A shows a schematic cross-sectional view of a step of a method for producing an optoelectronic semiconductor component and a schematic cross-sectional view of an optoelectronic semiconductor component according to a sixth exemplary embodiment.
Figure 17B:
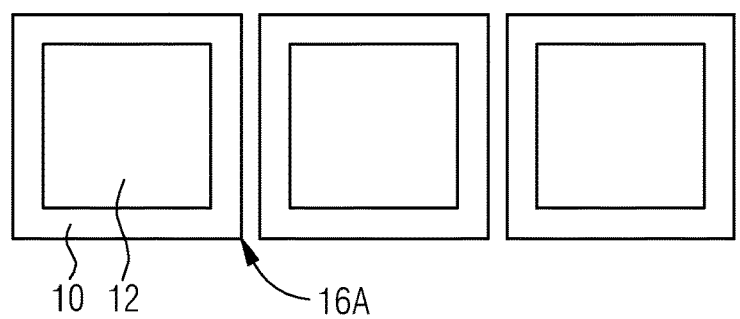
FIG. 17B shows a schematic top view of a rear side of the optoelectronic semiconductor component according to the sixth exemplary embodiment.

While the optoelectronic semiconductor components 16 shown in FIGS. 11B, 12, 13 are flip chips, in connection with FIG. 17 an optoelectronic semiconductor component 16 is described which is electrically connectable from the outside on two opposite sides by means of the first and second contact means 12, 17. Here, the second contact means 17 serves as a contact pad of a second conductivity type.

The optoelectronic semiconductor component 16 includes a second dielectric layer 22 arranged on the edge layer 11 and electrically insulating the edge layer 11 from the outside at the first main surface 9B or rear side 16A, so that the edge layer 11 is not exposed at the rear side 16A. Further, the edge layer 11 is electrically insulated from the outside at the side surfaces 9A by the second dielectric layer 22.

In this exemplary embodiment (cf. FIG. 17B), the first contact means 12 covers a large part of the first main surface 9B and advantageously forms a mirror coating at the rear side 16A.

Figure 18A:
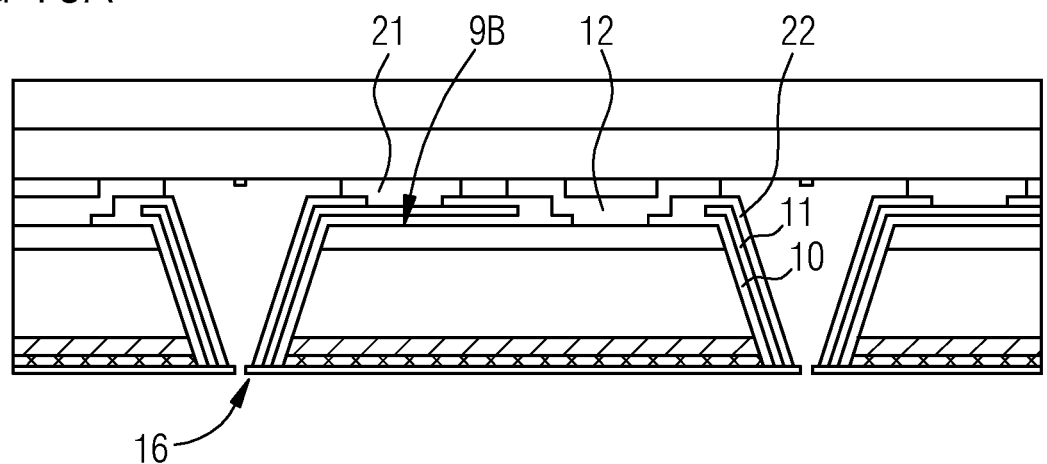
FIG. 18A shows a schematic cross-sectional view of a step of a method for producing an optoelectronic semiconductor component and a schematic cross-sectional view of an optoelectronic semiconductor component according to a seventh exemplary embodiment.
Figure 18B:
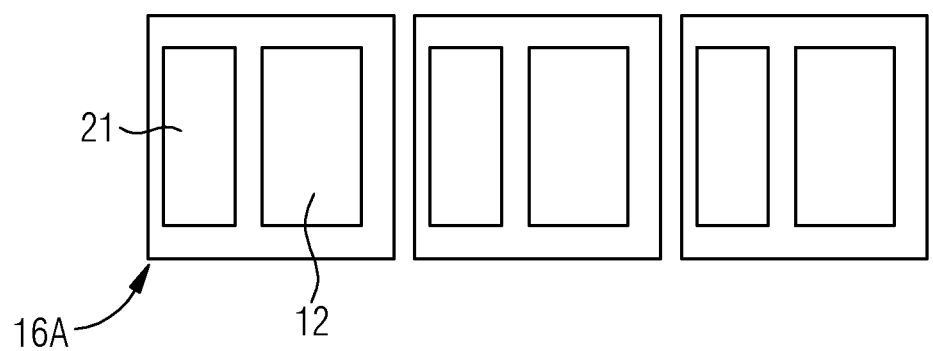
FIG. 18B shows a schematic top view of a bottom side of the optoelectronic semiconductor component according to the seventh exemplary embodiment.

FIG. 18 shows a further exemplary embodiment, in which the optoelectronic semiconductor component 16 also (cf. FIG. 17) includes a second dielectric layer 22 which is arranged on the edge layer 11 and which electrically insulates the edge layer 11 from the outside at the first main surface 9B or rear side 16A. Further, the edge layer 11 is electrically insulated from the outside at the side surfaces 9A by the second dielectric layer 22. In this exemplary embodiment, the optoelectronic semiconductor component 16 is a flip chip.

In contrast to the exemplary embodiment shown in FIG. 17, the second dielectric layer 22 comprises an opening in which a third contact means 21 is arranged for electrically contacting the edge layer 11 on the rear side 16A. The edge layer 11 and the third contact means 21 may be produced in two separate steps and thus may be formed from different materials.

The first contact means 12 and the third contact means 21 are arranged next to each other on the first main surface 9B. Thus, the optoelectronic semiconductor component 16 is electrically connectable from the outside on the side of the first main surface 9B or rear side 16A by means of the first contact means 12 and the third contact means 21.

The invention is not limited by the description based on the exemplary embodiments. Rather, the invention encompasses any new feature as well as any combination of features, which in particular includes any combination of features in the patent claims, even if this feature or combination itself is not explicitly stated in the patent claims or embodiments.

LIST OF REFERENCE SIGNS

1 semiconductor wafer
2 Semiconductor layer sequence
3 carrier
4 first semiconductor region of a first conductivity type
5 second semiconductor region of a second conductivity type
5A contact layer of the second semiconductor region
6 active zone
7 contact layer
8 recess
8A bottom surface of the recess
9 layer stack
9A side surface
9B first main surface
9C second main surface
10 first dielectric layer
10A end portion
11 edge layer
11A electrically conductive layer
11B end portion
12 first contact means
13 filling
14 intermediate carrier
15 connection layer
16 optoelectronic semiconductor component
16A rear side
16B front side
16C side edge
17 second contact means
18 transfer device
19 structural element
20 outcoupling structure
21 third contact means
22 second dielectric layer
L lateral direction
V vertical direction
b1, b2 lateral extent
d1, d2 thickness

The invention claimed is:

1. An optoelectronic semiconductor component comprising:
  a layer stack comprising:
    a first semiconductor region of a first conductivity type,
    a second semiconductor region of a second conductivity type,
    an active zone arranged between the first and second semiconductor regions,
    at least one side surface laterally delimiting the layer stack,
    a first main surface and a second main surface opposite the first main surface, the first and second main surfaces each being arranged transverse to the at least one side surface;
  a first contact means arranged at the first main surface and provided for electrically contacting the first semiconductor region;
  a second contact means arranged at the second main surface and provided for electrically contacting the second semiconductor region, the second contact means being radiation-transmissive;
  an electrically conductive edge layer arranged on the layer stack and extending from the second contact means over the side surface as far as the first main surface and having an end portion arranged at the second main surface, the end portion having a lateral extent corresponding to a thickness of the electrically conductive edge layer; and
  a first dielectric layer arranged between the edge layer and the layer stack, the second main surface not being covered by the first dielectric layer;
  wherein the optoelectronic semiconductor component is free of vias.

2. An optoelectronic semiconductor component comprising:
  a layer stack comprising:
    a first semiconductor region of a first conductivity type,
    a second semiconductor region of a second conductivity type,
    an active zone arranged between the first and second semiconductor regions,
    at least one side surface laterally delimiting the layer stack to the outside,
    a first main surface and a second main surface opposite the first main surface, the first and second main surfaces each being arranged transverse to the side surface;
  a first contact means arranged at the first main surface and provided for electrically contacting the first semiconductor region;
  a second contact means arranged at the second main surface and provided for electrically contacting the second semiconductor region, the second contact means being radiation-transmissive;
  an electrically conductive edge layer arranged on the layer stack and extending from the second contact means over the side surface as far as the first main surface, wherein the at least one side surface is covered by the edge layer at least for the most part; and
  a first dielectric layer arranged between the edge layer and the layer stack, the second main surface not being covered by the first dielectric layer, and the first dielectric layer being flush with the second main surface.

3. The optoelectronic semiconductor component according to claim 1, wherein the edge layer is arranged conformally on the at least one side surface.

4. The optoelectronic semiconductor component according to claim 1, wherein the second main surface is not covered by the edge layer.

5. The optoelectronic semiconductor component according to claim 1, wherein the edge layer does not project beyond the second main surface on a side of the second main surface facing away from the layer stack.

6. The optoelectronic semiconductor component according to claim 1, wherein the second semiconductor region comprises a contact layer arranged at the second main surface and formed from semiconductor material, and on which the second contact means is at least partially directly arranged.

7. The optoelectronic semiconductor component according to claim 1, wherein the second contact means comprises or consists of at least one of the following materials: TCO, metal, semiconductor, graphene, and combinations thereof.

8. The optoelectronic semiconductor component according to claim 1, wherein the second contact means is a layer deposited on the second main surface.

9. The optoelectronic semiconductor component according to claim 1, wherein the edge layer forms a mirror coating of the layer stack.

10. The optoelectronic semiconductor component according to claim 1, wherein the edge layer comprises or consists of at least one of the following materials: TCO, metal, graphene, and combinations thereof.

11. The optoelectronic semiconductor component according to claim 1, comprising a second dielectric layer arranged on the edge layer and electrically insulating the edge layer from the outside at the first main surface.

12. The optoelectronic semiconductor component according to claim 1, which is electrically connectable from the outside on two opposite sides by means of the first and second contact means.

13. The optoelectronic semiconductor component according to claim 1, wherein the optoelectronic semiconductor component is electrically connectable from the outside on a side of the first main surface by means of the first contact means and the edge layer or by means of the first contact means and a third contact means.

14. The optoelectronic semiconductor component according to claim 1, wherein the layer stack is mesa-shaped and the second main surface is larger than the first main surface.

15. The optoelectronic semiconductor component according to claim 1, wherein the second semiconductor region comprises structural elements at the second main surface.

16. The optoelectronic semiconductor component according to claim 1, further comprising an outcoupling structure arranged on the second main surface.

17. A method for producing at least one optoelectronic semiconductor component according to claim 1, wherein the method comprises:
  providing a semiconductor wafer comprising a carrier and a semiconductor layer sequence arranged on the carrier;
  producing at least one layer stack by creating at least one recess in the semiconductor wafer starting from a side of the semiconductor layer sequence facing away from the carrier;
  depositing a first dielectric layer on the semiconductor wafer such that the layer stack is covered by the first dielectric layer;
  depositing an electrically conductive layer to form an edge layer on the first dielectric layer;

exposing a second main surface of the layer stack, wherein portions of the first dielectric layer and the second semiconductor region are removed in a common step.

18. The method according to claim 17, further comprising singulating a plurality of layer stacks exposing the second main surface.

19. The method according to claim 18, further comprising removing portions of the edge layer when exposing the second main surface.

20. The method according to claim 18, wherein the exposure of the second main surface occurs by polishing, etching, a laser lift-off process, or combinations thereof.

* * * * *